United States Patent
Atsumi et al.

(10) Patent No.: US 6,324,100 B1
(45) Date of Patent: *Nov. 27, 2001

(54) NONVOLATILE SEMICONDUCTOR MEMORY DEVICE (75) Inventors: Shigeru Atsumi; Sumio Tanaka, both of Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/708,471

(22) Filed: Nov. 9, 2000

Related U.S. Application Data (63) Continuation of application No. 09/468,316, filed on Dec. 21, 1999, now Pat. No. 6,151,252, which is a continuation of application No. 09/228,278, filed on Jan. 11, 1999, now Pat. No. 6,011,723, which is a continuation of application No. 08/744,821, filed on Nov. 6, 1996, now Pat. No. 5,875,129, which is a division of application No. 08/436,563, filed on May 8, 1995, now Pat. No. 5,600,592, which is a continuation of application No. 08/332,493, filed on Oct. 31, 1994, now Pat. No. 5,438,542, which is a continuation of application No. 08/210,279, filed on Mar. 18, 1994, now abandoned.

(30) Foreign Application Priority Data

May 28, 1993 (JP) .................................... 5-126588

(51) Int. Cl.[7] .................................................. G11C 16/06
(52) U.S. Cl. .............................. 365/185.27; 365/185.24; 365/185.29
(58) Field of Search ..................... 365/185.27, 185.24, 365/185.26, 185.01, 185.29

(56) References Cited

U.S. PATENT DOCUMENTS 4,618,876  10/1986  Stewart et al. .................. 365/185
4,642,798   2/1987  Rao ................................. 365/230

(List continued on next page.)

FOREIGN PATENT DOCUMENTS

| 0 525 678 A2 | 2/1993 | (EP) . |
| 0 550 751 A1 | 7/1993 | (EP) . |
| 5-28784 | 2/1993 | (JP) . |
| 6-215591 | 8/1994 | (JP) . |

OTHER PUBLICATIONS

T. Nakayama, "A New Decoding Scheme and Erase Sequence for 5V Only Sector Erasable Flash Memory", 1992 Symposium on VLSI CIrcuit, Jun. 4–6, 1992/Seattle, pp. 22 & 23.

A. Umezawa, "A 5–V Only Operation 0.6–$\mu$ Flash EEPROM with Decoder Scheme in Triple–Well Structure", IEEE Journal of Solid–State Circuits, vol. 27, No. 11, Nov. 1992, pp. 1540–1545.

Jinbo, Toshikatsu et al., "A 5V–Only 16 Mb Flash Memory with Sector–Erase Mode", ISSCC 92 Session 9/Non–Volatile and Dynamic RAMs, Paper 9.4, 1992.

*Primary Examiner*—Vu A. Le
(74) *Attorney, Agent, or Firm*—Banner & Witcoff, Ltd.

(57) ABSTRACT

In a flash memory EEPROM, a memory cell MC is formed in a P-type semiconductor substrate. A peripheral transistor TR is formed in an N-type well. Another peripheral transistor TR is formed in a P-type well. The P-type well is by turn formed an N-type well and electrically insulated from the substrate. The substrate is typically provided with a metal back structure and its substrate voltage is set to predetermined voltages respectively for data erasure, data storage and data retrieval. With such an arrangement, the level of voltage stress with which the device is loaded during data erasure can be remarkably reduced to allow a down-sizing and an enhanced quality to be realized for the device.

8 Claims, 6 Drawing Sheets

| MODE | Vd | Vg | Vs | Vsub |
|---|---|---|---|---|
| READ | 1V | 5V | 0V | 0V |
| WRITE | 5V | 12V | 0V | 0V |
| ERASE | FLOATING | -VC | VA+VB | VA |

U.S. PATENT DOCUMENTS

| | | | |
|---|---|---|---|
| 4,879,679 | 11/1989 | Kikuda et al. | 365/182 |
| 4,893,257 | 1/1990 | Tanaka et al. | 365/189.09 |
| 4,907,058 | 3/1990 | Sekai | 257/371 |
| 5,010,520 * | 4/1991 | Minagawa et al. | 365/185.23 |
| 5,022,000 | 6/1991 | Terasawa et al. | 365/184 |
| 5,043,788 | 8/1991 | Omoto et al. | 257/371 |
| 5,047,981 | 9/1991 | Gill et al. | 365/185 |
| 5,051,953 | 9/1991 | Kitazawa et al. | 365/218 |
| 5,077,691 | 12/1991 | Haddad et al. | 365/218 |
| 5,122,985 | 6/1992 | Santin | 365/185 |
| 5,134,449 | 7/1992 | Gill et al. | 357/23.5 |
| 5,157,218 | 10/1992 | Santin et al. | 257/371 |
| 5,168,335 | 12/1992 | D'Arrigo et al. | 257/319 |
| 5,223,451 | 6/1993 | Vemura et al. | 257/371 |
| 5,243,559 | 9/1993 | Murai | 365/185 |
| 5,295,102 | 3/1994 | McClure | 365/200 |
| 5,295,106 | 3/1994 | Jinbo | 365/218 |
| 5,297,088 | 3/1994 | Yamaguchi | 365/200 |
| 5,374,838 | 12/1994 | Sawada et al. | 257/371 |
| 5,392,253 | 2/1995 | Atsumi et al. | 365/185.23 |
| 5,396,459 | 3/1995 | Arakawa | 365/185 |
| 5,402,382 | 3/1995 | Miyawaki et al. | 365/185.23 |
| 5,438,542 | 8/1995 | Atsumi et al. | 365/182 |
| 5,506,803 | 4/1996 | Jex | 365/185.23 |
| 5,600,592 | 2/1997 | Atsumi et al. | 365/185.27 |
| 5,619,450 | 4/1997 | Takeguchi | 365/189.09 |

* cited by examiner

NEGATIVE POTENTIAL

F I G. 4

F I G. 5

F I G. 6

| MODE | Vd | Vg | Vs | Vsub |
|---|---|---|---|---|
| READ | 1V | 5V | 0V | 0V |
| WRITE | 5V | 12V | 0V | 0V |
| ERASE | FLOATING | -VC | VA+VB | VA |

| | Vg | Vd | Vs | Vsub |
|---|---|---|---|---|
| WRITE (SUBSTRATE HOT ELECTRONS) | 10V | 0V | 0V | −10V |
| NON-WRITE | 0V | 0V | 0V | −10V |
| CHANNEL ERASE | −10V | FLOATING | FLOATING | 12V (Vpp) |

F I G. 16

NONVOLATILE SEMICONDUCTOR MEMORY DEVICE

This application is a continuation of prior application Ser. No. 09/468,316, filed Dec. 21, 1999 now U.S. Pat. No. 6,151,252, which is a continuation of prior application Ser. No. 09/228,278, filed Jan. 11, 1999 (now U.S. Pat. No. 6,011,723), which is a continuation of application Ser. No. 08/744,821, filed Nov. 6, 1996 (now U.S. Pat. No. 5,875,129), which is a divisional of application Ser. No. 08/436,543, filed May 8, 1995 (now U.S. Pat. No. 5,600,592), which is a continuation of application Ser. No. 08/332,493, filed Oct. 31, 1994 (now U.S. Pat. No. 5,438,542), which is a continuation of application Ser. No. 08/210,279, filed Mar. 18, 1994 (now abandoned).

BACKGROUND OF THE INVENTION

1. Field of the Invention

This invention relates to a nonvolatile semiconductor memory device capable of electrically programming or erasing data and, more particularly, it relates to a memory device to be used for a stacked gate type flash EEPROM in which a negative potential is applied to the control gate for erasing data.

2. Description of the Related Art

Conventionally, hot electrons are injected from the drain into the floating gate of a flash EEPROM with a stacked gate structure for writing or storing data therein. On the other hand, negative and positive electric voltages are respectively applied to the gate and the source of the device to cause a so-called Fowler-Nordheim (F-N) tunneling current to flow from the source for erasing the stored data.

Methods of manufacturing a flash EEPROM of the above described type have already been disclosed by the inventor of the present invention (Japanese Patent Applications KOKAI Application Nos. 3-186439 and 5-4305).

Figure 1:
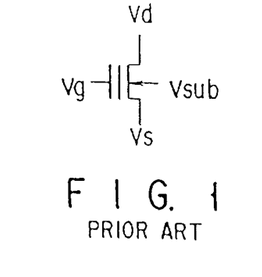
FIG. 1 symbolically shows a stacked gate type transistor constituting a flash EEPROM.
Figure 2:
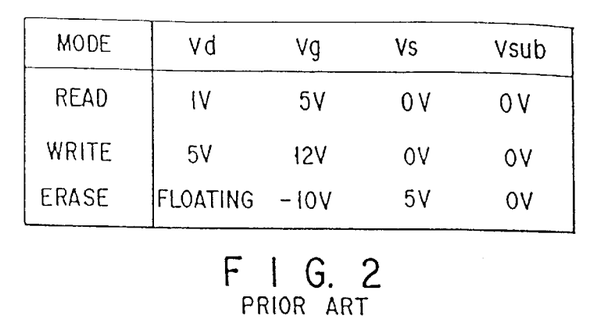
FIG. 2 is a chart showing bias voltages in read, write and erase modes used in a conventional operation for a flash EEPROM.

According to any of these known methods, bias voltages as typically shown in the chart of FIG. 2 are applied to the transistor (FIG. 1) of a memory cell for data storage, read or erasure. Referring to FIG. 2, Vsub denotes the electric potential of the substrate which is constantly held to 0V (ground potential), whereas Vg denotes the electric potential of the control gate that varies between −10V (for data erasure) and 12V (for date storage).

Figure 3:
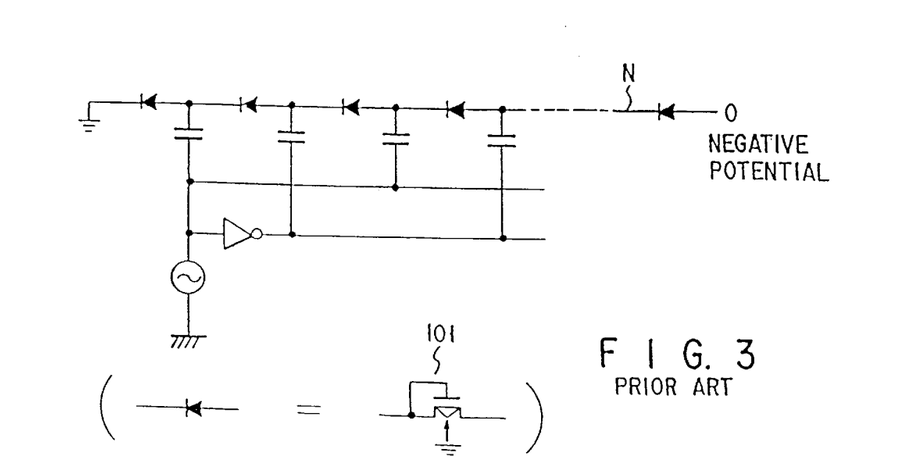
FIG. 3 is a circuit diagram of a negative voltage generating circuit.

However, there is a problem concerning stress voltage as discussed below that needs to be solved for a memory device of the category under consideration before it can meet the demand for extreme down-sizing and high performance that has become so strong in recent years.

a) Voltage Vg (=−10V) to be applied to the gate for erasing data is generated by a negative voltage generating circuit as typically illustrated in FIG. 3 that is arranged in the substrate of the device. While voltage Vg is available from terminal 0 of the circuit of FIG. 3, then potential vn of node N will be reduced to −10−vth (Vn=−10−vth, where Vth is a threshold voltage (approximately 3v) of P-channel type MOS transistor 101 with the gate and the drain connected).

b) If a decoding function is assigned to gate voltage Vg as disclosed in Japanese Patent Application KOKAI Publication No. 5-4305, a stress voltage equal to VSW−VBB (where VSW is the voltage of the power source of the row decoder which is approximately 5V for data erasure and VBB is a negative voltage (e.g. −10V)) is generated in the row decoder.

The stress voltage generated in a substrate makes a serious problem as devices are down-sized, because it is difficult to reduce the electric field required for the flow of an F-N tunneling current in response to the reduced size of the device.

Thus, the problem of a stress voltage generated in the substrate of a memory device of the type under consideration has provided a barrier to be overcome for realizing a small high quality memory device.

SUMMARY OF THE INVENTION

In view of the above identified problem, it is therefore an object of the present invention to provide a nonvolatile semiconductor memory device which is made free from any stress voltage that may be applied to various elements of the device such as transistors located close to the memory cells or a memory device in which data can be erased by an F-N tunneling current with a gate voltage that is lower than ever.

According to the invention, the above object is achieved by providing a nonvolatile semiconductor memory device with a stacked gate structure comprising a semiconductor substrate of a first conductivity type, first and second wells of a second conductivity typeformed in a surface region of the semiconductor substrate, a third well of the first conductivity type formed in the second well, a memory cell formed in the semiconductor substrate, a transistor of the first conductivity type formed in the first well for constituting a peripheral circuit, a transistor of the second conductivity type formed in the third well for constituting the peripheral circuit, and means for controlling the voltages of the semiconductor substrate and the source/drain and the control gate of the memory cell.

The voltage control means operates for data erasure in such a way that it a) either applies a first power supply voltage vcc (positive voltage) to the semiconductor substrate, a predetermined positive voltage obtained by reducing a second power supply voltage vpp (positive voltage) to the source of the transistor of the memory cell and a predetermined negative voltage to the control gate of the memory cell b) or applies a power supply voltage Vpp (positive voltage) to the semiconductor substrate and a predetermined negative voltage to the control gate of the memory device.

The voltage control means applies for data storage a predetermined negative voltage to the semiconductor substrate, a predetermined voltage to the source/drain of the memory and a predetermined positive voltage to the control gate of the memory cell.

For the purpose of the invention, since the memory cell is formed within the substrate and the transistors for constituting a peripheral circuit are formed in the wells, the voltage of the substrate can be made variable by providing the substrate with a metal back structure. Thus, if a positive voltage is applied to the substrate for data erasure, the gate may properly operate with a negative voltage much lower than the conventional level to allow the device to be down-sized and show an improved performance.

For a memory device according to the invention, the data storage using channel erasure or substrate hot electrons can be carried out without applying a high voltage to the transistors constituting the peripheral circuit. It also allows the substrate voltage of the memory cell to be held stable when channel hot electrons are injected for data storage.

Additional objects and advantages of the invention will be set forth in the description which follows, and in part will be obvious from the description, or may be learned by practice of the invention. The objects and advantages of the invention may be realized and obtained means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Now, the present invention will be described in greater detail by referring-to the accompanying drawings that illustrates a preferred embodiment of the invention.

Figure 4:
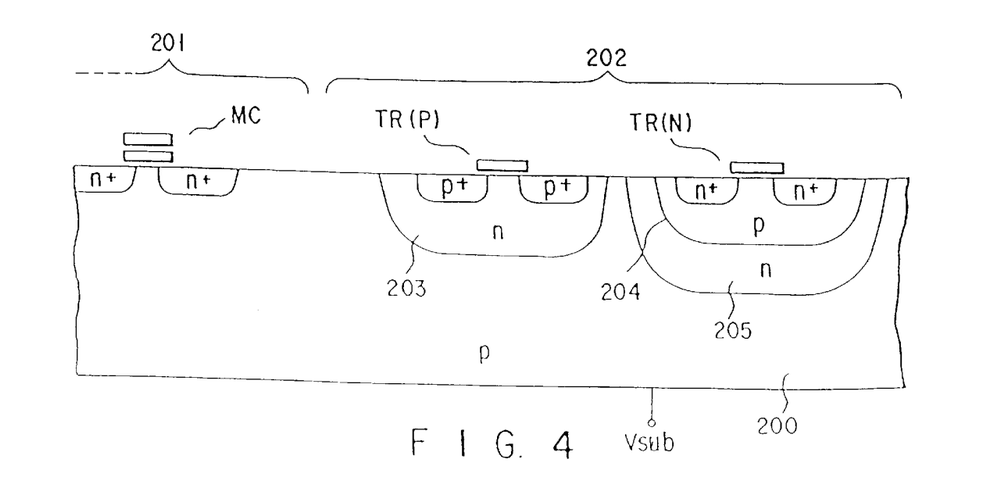
FIG. 4 is a schematic partial sectional view of a nonvolatile semiconductor memory device according to an embodiment of the invention.

FIG. 4 is a schematic partial sectional view of a preferred embodiment of flash EEPROM, showing only a principal portion thereof. Referring to FIG. 4, the embodiment has a region 201, where a memory cell MC constituted of a stacked gate type transistor is formed, and a region 202, where P- and N-type MOS transistors TR(P) and TR(N) for constituting a circuit around the periphery of the memory cell MC (hereinafter referred to as peripheral circuit) are formed. The memory cell MC is formed on a P-type semiconductor substrate 200. The P-type MOS transistor TR(P) for constituting the peripheral circuit is formed within an N-type well 203, which is by turn formed in a surface region of the semiconductor substrate 200. On the other hand, the N-type MOS transistor TR(N) for constituting the peripheral circuit is formed in a P-type well 204, which is by turn formed in an N-type well 205. The N-type well 205 is on its part formed on a surface region of the semiconductor substrate 200. Thus, the P-type well 204 is electrically insulated from the semiconductor substrate 200.

Figure 5:
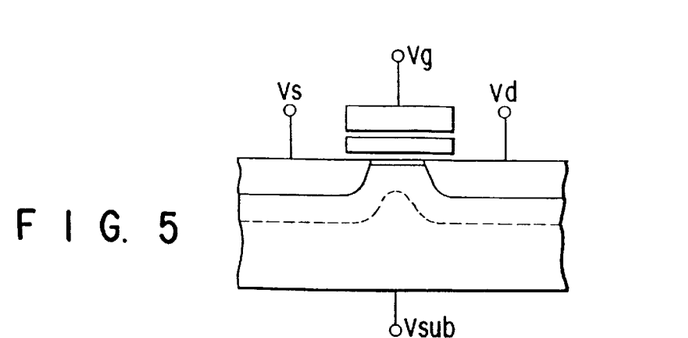
FIG. 5 is a schematic partial sectional view of the embodiment of FIG. 4, showing only the memory cell thereof.
Figure 6:
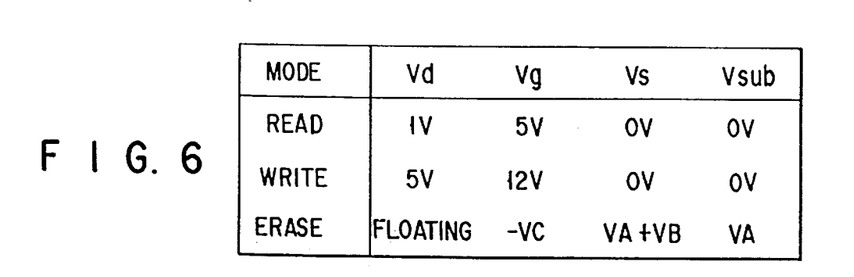
FIG. 6 is a chart showing bias voltage levels to be used for the operation of the embodiment in read, write. and erase modes.

FIG. 5 is a schematic partial sectional view of the embodiment of FIG. 4, showing only the memory cell thereof, and FIG. 6 is a chart showing bias voltage levels to be used for the operations of read, storage and erasure of data to be carried out on the embodiment in different modes.

The most remarkable feature of a semiconductor memory device according to the invention is that the substrate voltage vsub of the memory cell is variable for different modes. This will be described in detail. For reading data from or writing data in the embodiment, the substrate voltage vsub is held to 0V (ground potential) as in the case of comparable conventional devices. The source voltage Vs, the gate voltage Vg and the drain voltage Vd of the memory cell are biased the same as those of comparable conventional devices for data retrieval and data storage.

For erasing data from the memory cell, however, it operates in a different bias mode such that the substrate voltage Vsub of the memory cell is held to a positive voltage VA while the source voltage Vs and the gate voltage Vg are respectively set to VA+VB (positive voltage) and −VC (negative voltage). Note that the drain voltage Vd of the memory cell is kept floating as ever.

In such a bias voltage condition set for data erasure, if the substrate voltage Vsub is held to its reference level, the source voltage Vs and the gate voltage Vg of the memory cell will be respectively VB and −VA−VC. Thus, although the bias voltage condition is equivalent to that of conventional devices, the stress voltage applied to the transistors constituting the peripheral circuit can be remarkably reduced by setting appropriate values for VA and VC.

Figure 7:
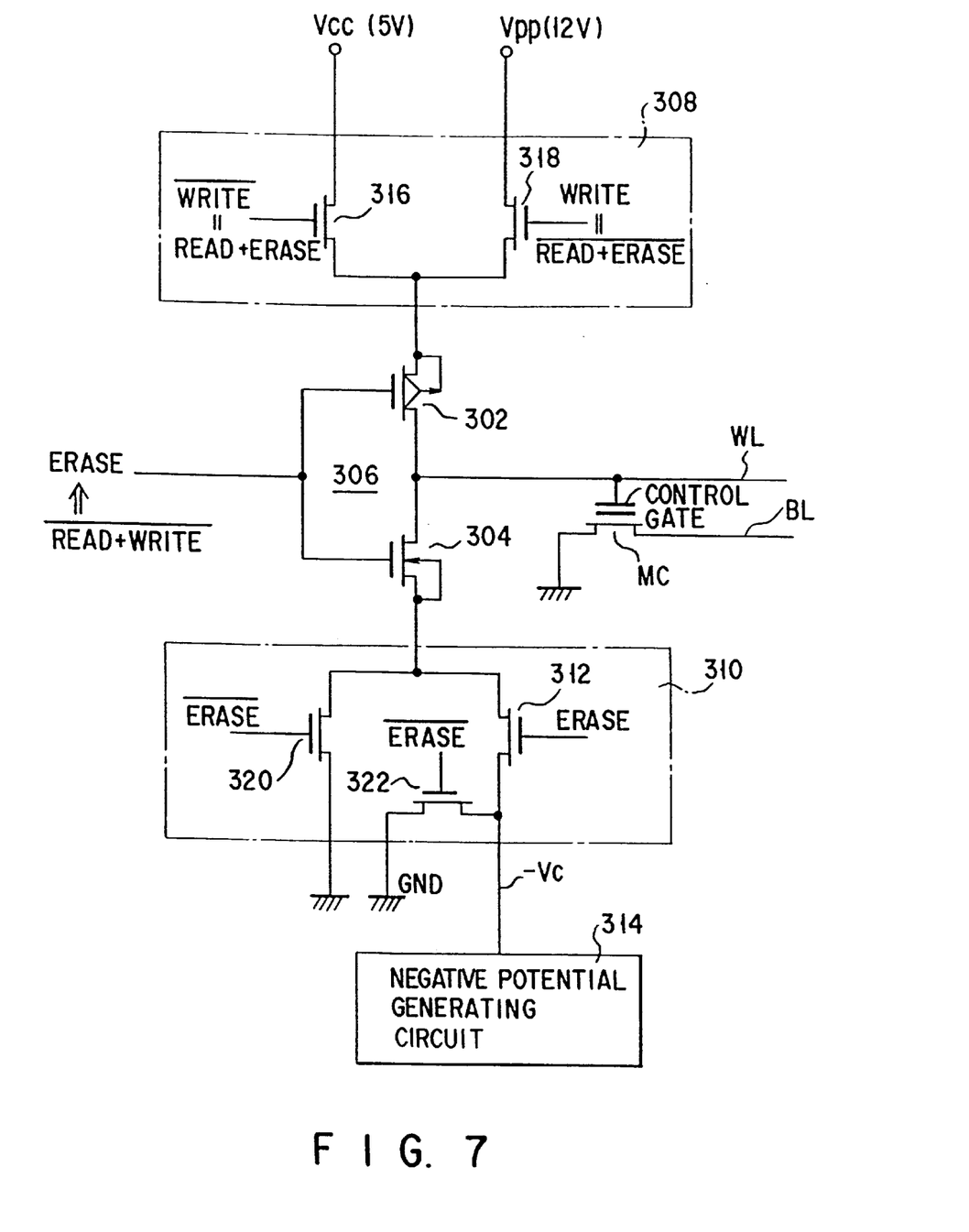
FIG. 7 is a circuit diagram of a control gate potential control circuit for controlling a control gate potential of a memory cell.

Now, a control circuit for controlling the gate bias of the memory cell will be described. As shown in the circuit diagram of FIG. 7, this control circuit comprises a CMOS inverter 306 constituted of a p-channel transistor 302 and an n-channel transistor 304, a switching circuit 308 for selecting a first power supply voltage Vcc which is generally 5V in the read-mode or a second power supply voltage Vpp which is generally 12V in the write-mode and a switching circuit 310 for selecting the ground potential GND in the non-erase mode or a negative voltage −Vc in the erase mode. The output of the CMOS inverter 306 is connected to a word line WL, which is connected to the control gate of the memory cell MC. When an erase signal ERASE is input to the CMOS inverter 306, the n-channel transistor of the CMOS inverter is turned on. The switching circuit 310 has a circuit configuration as illustrated in FIG. 7 and, once an erase signal is given, the transistors 320 and 322 are turned off and the transistor 312 is turned on by it to output a negative voltage −Vc coming from a negative potential generating circuit, typically, a negative potential charge pump 314 to the word line WL connected to the output of the CMOS inverter through the n-channel transistor 304 and then further to the control gate of the memory cell connected to the word line WL. On the other hand, the switching circuit 308 has a circuit configuration as illustrated in FIG. 7 and, if a signal $\overline{\text{WRITE}}$ is input, its reading transistor 316 is turned on by it to output a 5V whereas, if a signal WRITE is input, its writing transistor 318 is turned on by it to output a 12V. Since the p-channel transistor 302 of the CMOS inverter 306 is on and its n channel transistor 304 is off in the read- and write-modes, 5V and 12V are applied to the control gate of the memory cell respectively in the read mode and the write-mode. The negative charge pump 314 may well have such a circuit configuration of ring oscillator structure as shown in FIG. 3.

Figure 8:
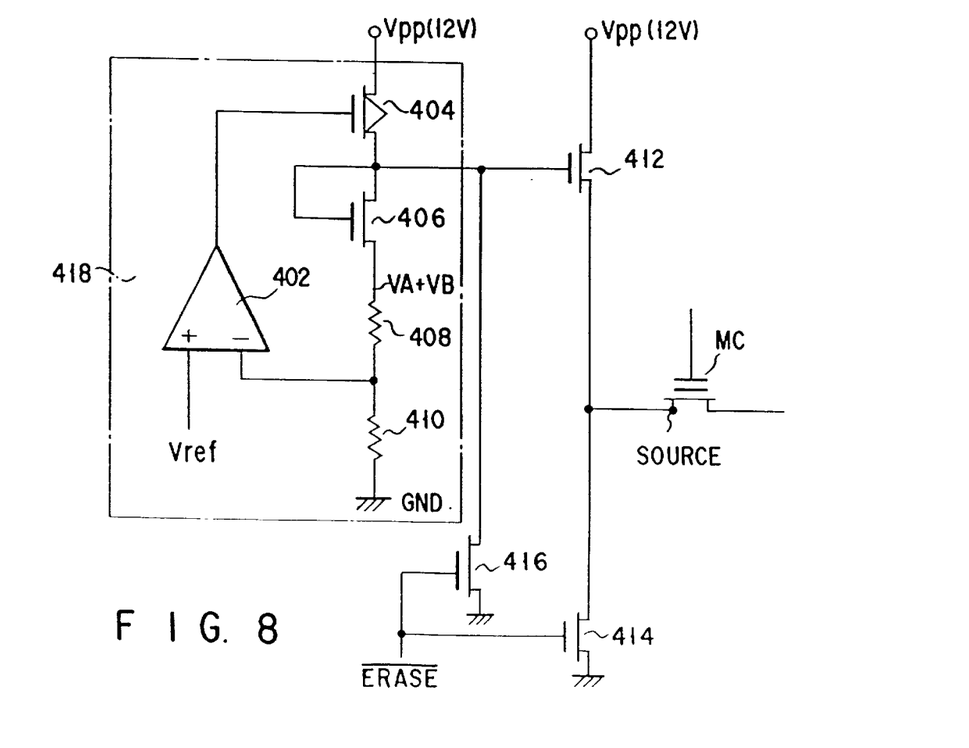
FIG. 8 is a circuit diagram of a source potential control circuit for controlling a source potential of a memory cell.

FIG. 8 is a circuit diagram of a control circuit for controlling the potential of the source of the memory cell. The control circuit comprises a feedback circuit realized by using an operational amplifier 402, a p-channel transistor 404, an n-channel transistor 406 and a pair of resistors 408 and 410 connected in series between the Vpp (12V) and the ground potential GND. The output of the operational amplifier 402 is connected to the input of the gate of the p-channel transistor 404 and its inverted input is connected to the contact of. the pair of resistors 408 and 410. A constant voltage generating circuit 418 is constituted of the operational amplifier 402, the p-channel—and n-channel transistors 404 and 406 and the resistors 408 and 410. The gate of the n-channel transistor 406 is connected to the gate of an n-channel output transistor 412. The source of the n-channel transistor 412 is connected to the ground potential GND by way of a non-writing transistor 414. The pair of resistors 408 and 410 are so designed that the contact between the feedback resistor 408 and the n-channel transistor 406 show a voltage of VA+VB. The n-channel transistor 406 and the n-channel output transistor 412 have substantially the same threshold value. Since the transistors 414 and 416 are off in the erase-mode, VA+VB is applied to the source of the memory cell MC. In other words, since the threshold value of the n-channel transistor 406 and that of the n-channel output transistor 414 cancel out each other, the potential VA+VB of the contact between the resistor 408 and the n-channel transistor 406 remains unaffected before it is applied to the source of the memory cell. In a mode for other than erasure, the transistors 414 and 416 are turned on to bring the source of the memory cell MC and the gate of the n-channel transistor 412 down to the ground potential GND.

Figure 9:
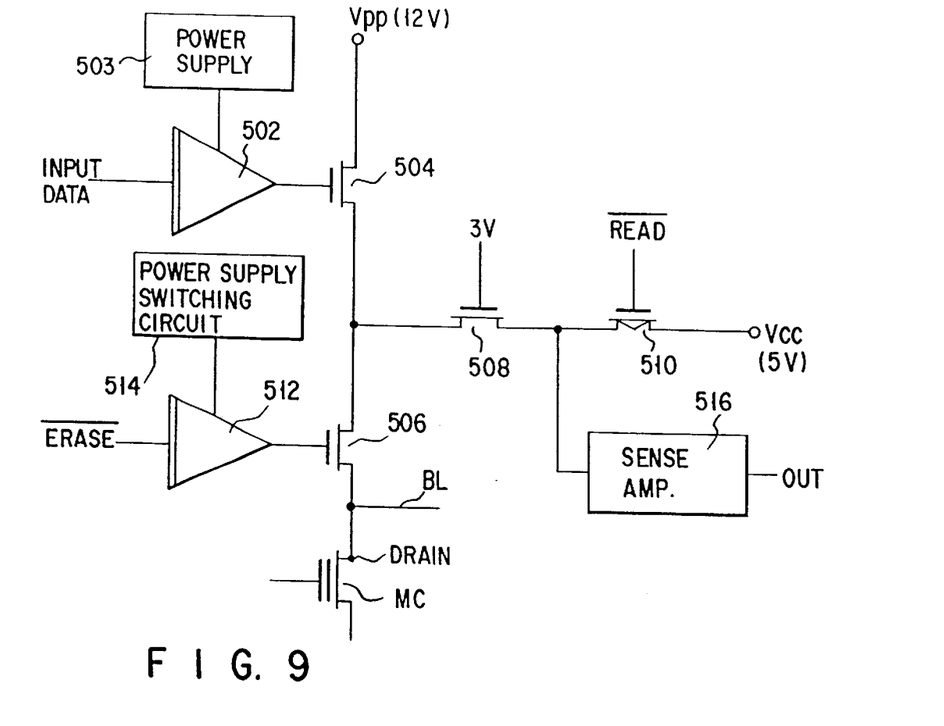
FIG. 9 is a circuit diagram of a drain potential control circuit for controlling a drain potential of a memory cell.

FIG. 9 is. a circuit diagram of a circuit for controlling the potential of the drain of the memory device. A level shifter 502 is connected to the gate of an n-channel output transistor 504. A power supply 503 is connected to the level shifter 502. The power supply 503 may have such a structure of the circuit 418 as shown in FIG. 8. However, the power supply 503 supplies a voltage of 5V+Vth. Vth equals to the threshold value of the transistor 504. The level shifter 502 receives input data and outputs 5V+Vth or 0v in accordance with the logic level of the input data. The output transistor 504 is connected to the drain of the memory cell MC by way of an n-channel transistor 506. The gate of the transistor 506 is connected to an output of a level shifter 512. A power supply switching circuit 514 is connected to the level shifter 512. The power supply switching circuit 514 may have such a structure as the circuit 308 as shown in FIG. 7. The level shifter receives a signal $\overline{\text{ERASE}}$. The node of the transistor 504 and the n-channel transistor 506 is connected via n- and p-channel transistors 508 and 510 to the power source potential Vcc which is equal to 5V. The transistor 508 has a threshold voltage of 2V, the gate being supplied with 3V in the read mode. A sense amplifier 516 is connected to the contact of the n- and p-channel transistors 508 and 510.

In the data erase mode, the level shifter 512 outputs the ground level. Thus, the transistor 506 is turned off to make the drain potential of the memory cell MC floating. In the data write mode, the level shifter 512 outputs Vpp of 12V to turn the transistor 506 on. Thus, when the input data is 0, the level shifter 502 outputs 5V+Vth to the gate of the transistor 504 having a threshold of Vth, and 5V is applied to the drain of the memory cell MC through the transistor 506. When, however, the input data is 1, the level shifter 502 outputs the ground voltage to the transistor 504, and 0v (ground level) is applied to the drain of the memory cell MC. In the read mode, the transistors 506 and 510 are turned on so that a source potential of 1V of the transistor 508 is applied to the drain of the memory cell MC. The drain potential is amplified by the sense amplifier 516 to find out the data level.

Figure 10:
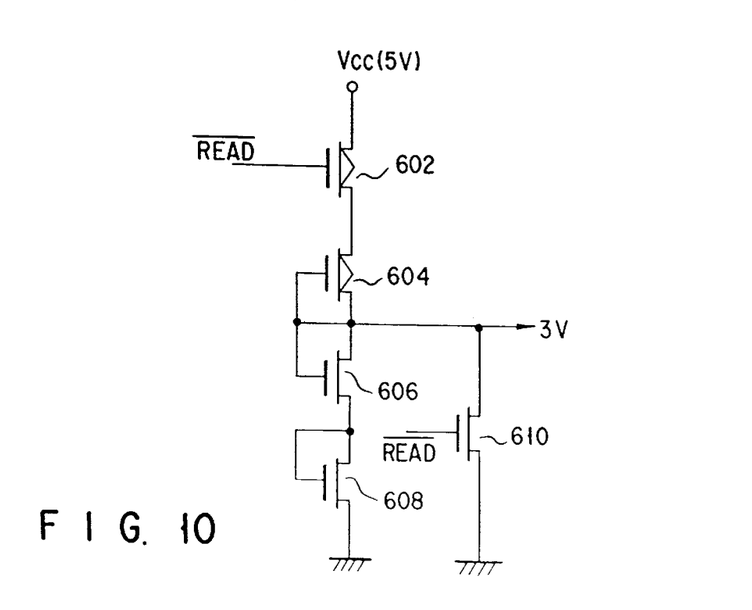
FIG. 10 is a potential generating circuit for generating a potential to be applied to the drain potential control circuit shown in FIG. 9.
Figure 11:
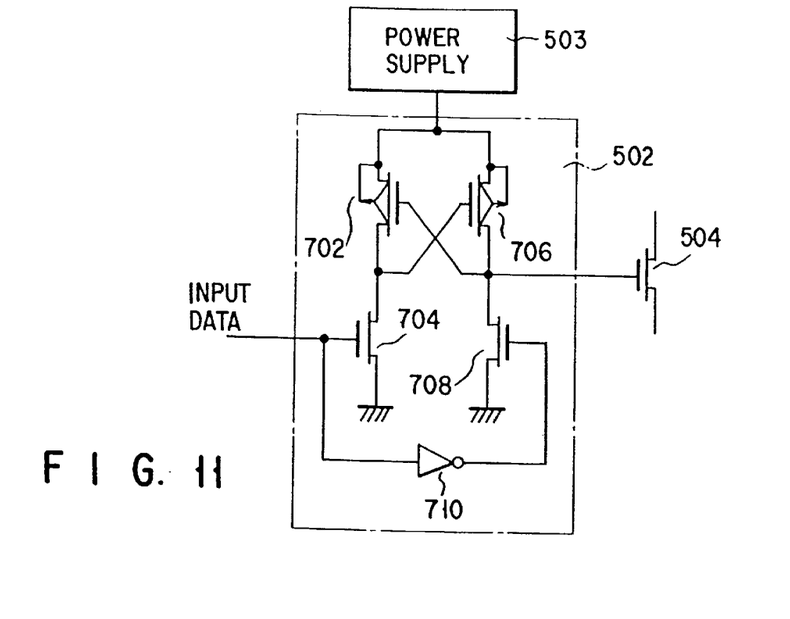
FIG. 11 is a circuit diagram of the level shifter 502 used in the drain potential control circuit shown in FIG. 9.

A circuit for generating 3V applied to the gate of transistor 508 has such a structure as shown in FIG. 10. P-channel transistors 602, 604 and n-channel transistors 606 and 608 are connected in series between Vcc (5V) and the ground. The transistors 606 and 608 have threshold voltages of 2V and 1V, respectively. The gate of the transistor 602 receives a signal $\overline{\text{READ}}$. The node of the transistors 604 and 606 constitutes an output terminal of the 3V generating circuit, and an n-channel transistor 610 is connected between the output terminal and the ground, the gate receiving $\overline{\text{READ}}$. In the data read mode, the transistor 602 is turned on and the transistor 610 is turned off, and the potential of the output terminal, i.e., the node between the transistors 604 and 606, is 3V which is the total voltage drop of the threshold voltage 2V and 1V of transistors 606 and 608, respectively.

Figure 12:
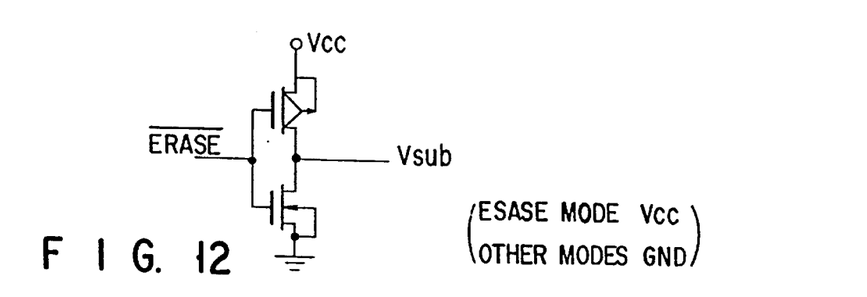
FIG. 12 is a circuit diagram of a substrate potential generating circuit.
Figure 13:
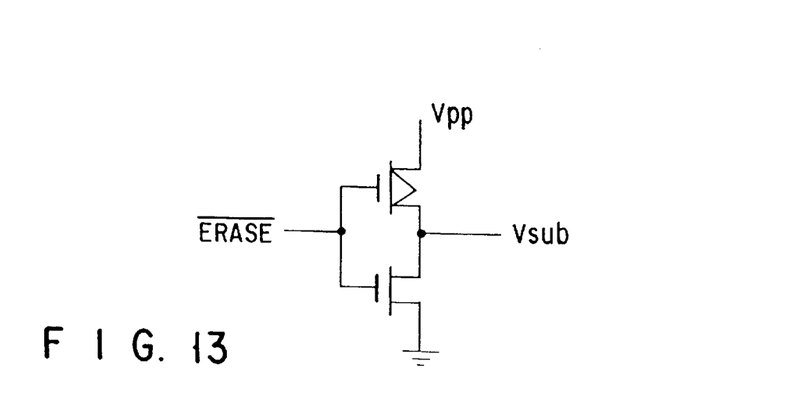
FIG. 13 is a circuit diagram of another substrate potential generating circuit.

FIGS. 12 and 13 also show a possible circuit for generating a semiconductor substrate voltage Vsub.

A circuit shown in FIG. 12 comprises a CMOS inverter whose p-channel transistor is connected to a power supply voltage Vcc of 5V and controlled by signal $\overline{\text{ERASE}}$ to make the substrate voltage vsub (=VA) equal to the power supply voltage Vcc (=5V). The source voltage vs (=VA+VB) is either the supply voltage Vpp or equal to a predetermined voltage obtained by dropping the supply voltage Vpp.

Alternatively, a circuit shown in FIG. 13 comprises a CMOS inverter whose p-channel transistor is connected to a supply voltage Vpp of 12V, and controlled by signal $\overline{\text{ERASE}}$ to make the substrate voltage Vsub (=VA) equal to the supply voltage Vpp (=12V). This arrangement is suited for the operation of channel erasure, which will be described later.

With another conceivable technique of using a positive voltage generated in the substrate for the substrate voltage of the memory cell, the memory cell may be formed in a P-type well in the substrate so that the potential of the P-type well is used for the substrate voltage of the memory cell. This technique is, however, accompanied by the following drawback;

a) The substrate voltage (well potential) is unstable during a data writing operation.

Figure 14:
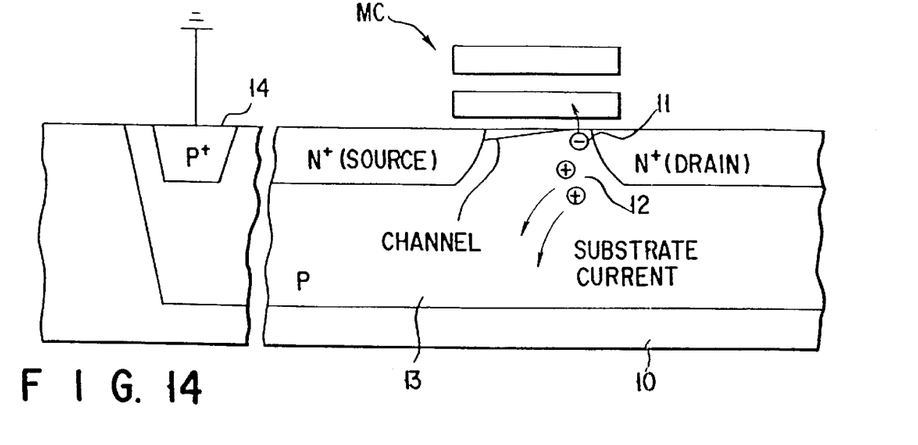
FIG. 14 is a schematic partial sectional view of a nonvolatile semiconductor memory device, in which a flow of an electric current is shown.

As electrons are accelerated by a depletion layer located close to the drain as shown in FIG. 14, a number of electron-hole pairs are generated near the drain. Part of the generated electrons 11 are then injected into the floating gate to form a gate current and data are written by the change in the threshold value. On the other hand, the holes 12 flow out to a P-type well 13 to produce a substrate current. The holes 12 are then discharged from a contact section 14 for producing the potential of the well 13, the contact section 14 being a flat section formed on the well 13. Consequently, if the memory cell-MC and the contact section 14 are separated from each other by a relatively large distance, the substrate voltage (well potential) is inevitably unstable during a data writing operation due to the resistance of the well 13.

b) The substrate voltage (well potential) is unstable during a data erasing operation.

A so-called band gap current flows out from the source side of the memory cell during a data erasing operation. The band-gap current is as strong as tens of several microamperes when data are erased on a large scale (e.g. in units of a megabyte). Therefore, the substrate voltage (well potential) is inevitably unstable during a data writing operation for the reason same as that of item a) above if the memory cell is located in the P-type well.

Figure 15:
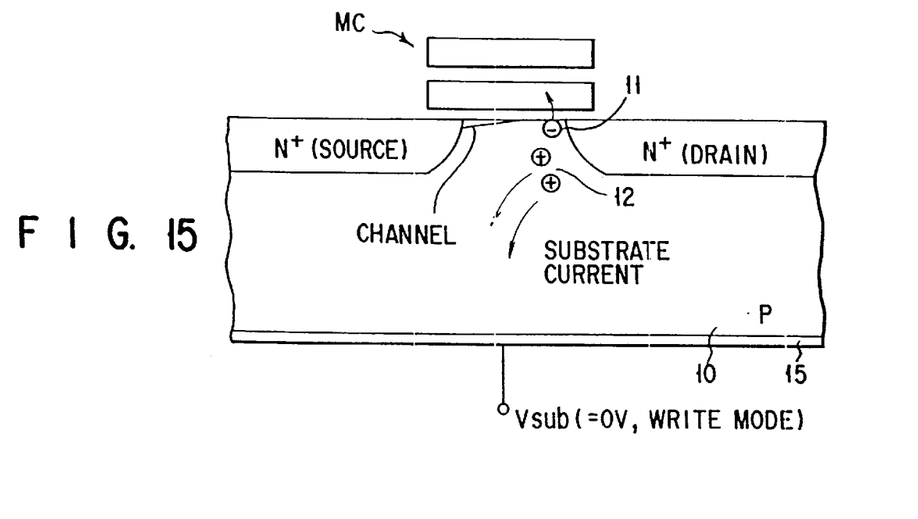
FIG. 15 is a schematic partial sectional view of another nonvolatile semiconductor memory device, in which a flow of an electric current is shown.

Contrary to the above technique, according to the present invention, a substrate voltage Vsub can be supplied from the rear surface of the substrate (chip) 10 on a stable basis by providing the P-type semiconductor substrate 10 with a metal back structure by a metal layer 15 as shown in FIG. 15. Thus, a device according to the invention is free from the above identified drawbacks a) and b) of an unstable substrate voltage.

Additionally, the substrate voltage vsub (=VA) may be made equal to the supply voltage Vcc (–5V) or the supply voltage Vpp (–12V) as shown in FIGS. 12 and 13 to secure a sufficient power supply potential for the device so that the substrate voltage Vsub always remains stable.

Thus, in a semiconductor memory device according to the invention, a memory cell is formed on a substrate, which is provided with a metal back structure so that a stable substrate voltage is ensured for both data writing and data erasure. Furthermore, a semiconductor memory device according to the present invention are particularly effective in the following operations.

a) Channel Erasure

Figure 16:
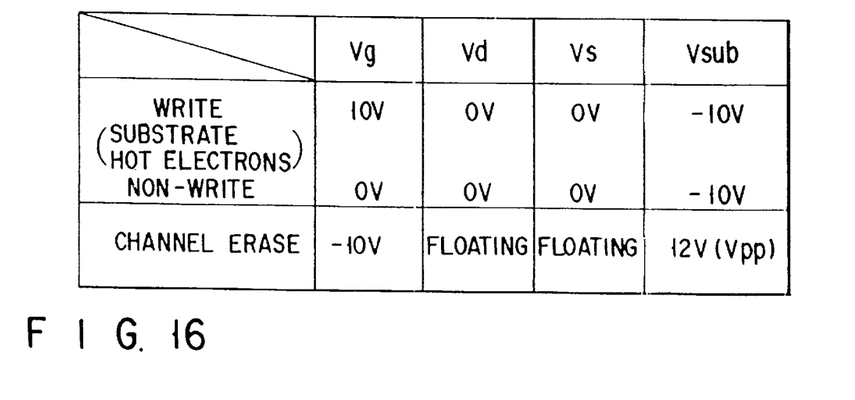
FIG. 16 is another chart showing bias voltages in read, write and erase modes used in the operation of a flash EEPROM according to the present invention.

Channel erasure is an operation of erasing data by applying a high voltage between the control gate of the memory cell and the channel (substrate). To achieve this, it is necessary to form the memory cell in a P-type well and cause a transistor located in a peripheral area of the memory cell to produce a voltage of approximately –20V if the P-type well is held to the ground potential so that the voltage of –20V may be applied to the control gate of the memory cell. However, if the device is made to have a structure as shown in FIG. 4, then only a voltage Vg of approximately –10V may be sufficient for the control gate of the memory cell provided that the substrate voltage Vsub is held equal to the supply voltage Vpp (=12V) as illustrated in FIG. 16. This reduction in the substrate voltage greatly helps the attempt of down-sizing the device. The source/drain voltage (Vs, Vd) is floating.

b) Collective Data Writing by Means of Substrate Hot Electrons

As described earlier, the operation of generating channel hot electrons in the vicinity of the drain involves a large substrate current for data writing and hence is not feasible with simultaneous data writing for a plurality of memory cells in a large number of bytes (more than several Kbits). This is mainly because the gate current is very small relative to the channel current that flows during the data writing operation (or electrons are injected into the floating gate poorly efficiently). A poor efficiency of electron injection then gives rise to the problem of a prolonged data writing operation before data erasure and that of a prolonged period for an erasing/writing cycle test that can seriously damage the reliability of the test.

A promising solution for the above identified problems is collective data writing by means of substrate hot electrons. with this technique, a relatively high voltage is applied between the control gate of the memory cell and the substrate while an voltage of a intermediate level is applied to the source/drain to form a channel for data writing. Then, part of the electrons accelerated by a depletion layer between the substrate and the channel are made to jump over the barrier of gate oxide film and injected into the floating gate.

Collective data writing by means of substrate hot electrons is a technique that can improve the efficiency $\eta$ of injecting electrons into the floating gate ($\eta$=gate current/substrate current) as compared with injection of channel hot electrons. Thus, this technique allows simultaneous data writing for a plurality of memory cells to reduce the time required for a erasing/writing cycle test (screening) and for data writing before data erasure.

In short, a semiconductor memory device according to the invention allows collective data writing by means of substrate hot electrons by controlling the biased condition of the related voltages as shown in FIG. 16. If the control gate voltage Vg of the memory cell is 10V (produced by the supply voltage Vpp), the substrate voltage Vsub is –10V (generated in the substrate) and the source/drain voltage Vs, Vd is 0V (ground potential), the voltage to be applied to the transistors constituting a peripheral circuit is held as low as 10V for collective data writing by means of substrate hot electrons. The non-writing gate voltage Vg of the memory cell is held to 0V (ground potential)

As described above in detail, a nonvolatile semiconductor memory device according to the invention have the following advantages.

Firstly, by forming a memory cell within a substrate and transistors for constituting a peripheral circuit in a well formed in the substrate and providing the substrate with a metal back structure, the substrate voltage can be made variable. Thus, if the substrate voltage Vsub and the source voltage Vs are respectively set to 5V and 10V for data erasure, the gate voltage Vg may be as low as –5V (a negative voltage) and can be generated in the peripheral circuit to reduce the voltage stress of the transistors of the peripheral circuit.

Secondly, since the operation of channel erasure and that of collective data writing by means of substrate hot electrons can be carried out without producing large voltage stress in the transistors of the peripheral circuit and the substrate voltage of the memory cell can be kept stable for collective data writing by means of substrate hot electrons, the device allows extreme down-sizing and an enhancement of its quality.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A nonvolatile semiconductor memory device comprising:
   a semiconductor substrate having a P-type conductivity region electrically separated from a peripheral circuit; and
   a stacked gate memory cell having a control gate, a charge storing layer, a source, and a drain, said stacked gate memory cell being formed in said P-type conductivity region, wherein a gate potential greater than a potential of the semiconductor substrate is applied to the control gate of the stacked gate memory cell in a data write mode to write data in the stacked gate memory cell, a source potential between the gate potential and the substrate potential is applied to the source of the stacked gate memory cell in the data write mode, a drain potential between the gate potential and the substrate potential is applied to the drain of the stacked gate memory cell in the data write mode, and a channel potential is applied to a channel of the stacked gate memory cell in the data write mode to write data in the stacked gate memory cell.

2. The nonvolatile semiconductor memory device according to claim 1, wherein the channel potential applied to the channel of said stacked gate memory cell is substantially the same as the potential of said semiconductor substrate.

3. The nonvolatile semiconductor memory device according to claim 2, wherein the channel potential applied to the channel of said stacked gate memory cell is a ground potential.

4. The nonvolatile semiconductor memory device according to claim 1, wherein the channel potential applied to the channel of said stacked gate memory cell is an intermediate potential between the potential of said semiconductor substrate and the gate potential applied to the control gate.

5. The nonvolatile semiconductor memory device according to claim 1, wherein a gate potential lower than a potential of the semiconductor substrate is applied to the control gate of the stacked gate memory cell in a data erase mode to erase data in the stacked gate memory cell, and a positive potential is applied to the semiconductor substrate in the data erase mode to erase data in the stacked gate memory cell.

6. The nonvolatile semiconductor memory device according to claim 2, wherein a gate potential less than a potential of the semiconductor substrate is applied to the control gate of the stacked gate memory cell in a data erase mode to erase data in the stacked gate memory cell, and a positive potential is applied to the semiconductor substrate in the data erase mode to erase data in the stacked gate memory cell.

7. The nonvolatile semiconductor memory device according to claim 3, wherein a gate potential less than a potential of the semiconductor substrate is applied to the control gate of the stacked gate memory cell in a data erase mode to erase data in the stacked gate memory cell, and a positive potential is applied to the semiconductor substrate in the data erase mode to erase data in the stacked gate memory cell.

8. The nonvolatile semiconductor memory device according to claim 4, wherein a gate potential less than a potential of the semiconductor substrate is applied to the control gate of the stacked gate memory cell in a data erase mode to erase data in the stacked gate memory cell, and a positive potential is applied to the semiconductor substrate in the data erase mode to erase data in the stacked gate memory cell.

* * * * *